United States Patent [19]

Sasaki et al.

[11] Patent Number: 4,558,292

[45] Date of Patent: Dec. 10, 1985

[54] LOW PASS FILTER

[75] Inventors: Itsuo Sasaki, Kawasaki; Kenji Matsuo, Yokohama, both of Japan

[73] Assignee: Tokyo Shibaura Denki Kabushiki Kaisha, Japan

[21] Appl. No.: 394,613

[22] Filed: Jul. 2, 1982

[30] Foreign Application Priority Data

Sep. 1, 1981 [JP] Japan .................................. 56-137234

[51] Int. Cl.[4] .......................................... H03H 11/00
[52] U.S. Cl. ...................................... 333/173; 330/109
[58] Field of Search ........................ 333/173, 172, 213; 307/362, 520; 330/107, 51, 261

[56] References Cited

U.S. PATENT DOCUMENTS

| 3,814,957 | 6/1974 | Way ...................................... 307/310 |
| 4,260,946 | 4/1981 | Wheatley ............................ 323/314 |
| 4,313,096 | 1/1982 | Fleischer ............................ 333/173 |
| 4,315,227 | 2/1982 | Fleischer et al. .................... 333/173 |
| 4,333,064 | 6/1982 | Kato et al. .......................... 333/173 |
| 4,378,538 | 3/1983 | Gignoux ............................. 333/173 |

OTHER PUBLICATIONS

Pierce, J. F., Transistor Circuit Theory and Design, Charles E. Merrill Books Inc., 1963, pp. 190, 212.
Davis, EDN, "Switched-Capacitor Techniques Implement Effective IC Filters", Nov. 5, 1979 (pp. 103-108).
Brodersen et al., Proceedings of the IEEE, "MOS Switched-Capacitor Filters", vol. 67, No. 1, Jan. 1979 (pp. 61-75).
Gregorian, "Filtering Techniques with Switched-Capacitor Circuits", Microelectronics Journal, vol. 11, No. 2, Apr. 1980, pp. 13-21.
Bosshart, "A Multiplexed Switched Capacitor Filter Bank", IEEE Journal of Solid-State Circuits, vol. SC-15, No. 6 (Dec. 1880), pp. 939-945.

Primary Examiner—Eugene R. LaRoche
Assistant Examiner—Benny T. Lee
Attorney, Agent, or Firm—Finnegan, Henderson, Farabow, Garrett & Dunner

[57] ABSTRACT

A low pass filter which comprises first, second and third switched capacitor circuits connected to a power source $V_{DD}$ and/or a power source $V_{SS}$, first and second operational amplifiers driven by the power sources $V_{DD}$ and $V_{SS}$, and a bias circuit connected between the power sources $V_{DD}$ and $V_{SS}$ for providing a bias voltage to the non-inverting input terminals of the first and second amplifiers.

5 Claims, 17 Drawing Figures

LOW PASS FILTER

Copending U.S. patent application Ser. No. 647,280 to Sasaki, filed Sept. 5, 1984, is noted for cross-reference purposes. Application Ser. No. 647,280 is a continuation of U.S. patent application Ser. No. 394,612, filed July 2, 1982, and now abandoned.

BACKGROUND OF THE INVENTION

The present invention relates to a low pass filter formed of a switch capacitor integrator in use for electronic filters, voice recognition circuits and voice composing circuits.

Figure 1A:
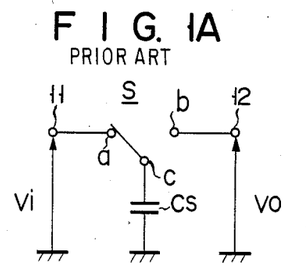
FIGS. 1A and 1B are circuit diagrams of a basic circuit of a switched capacitor circuit.
Figure 1B:
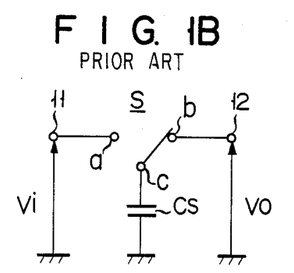
Figure 2:
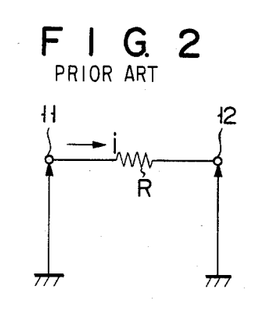
FIG. 2 is an equivalent circuit of the circuit shown in FIGS. 1A and 1B.

FIGS. 1A and 1B show a basic circuit of a switched capacitor circuit and FIG. 2 shows its equivalent circuit. In these figures, a switch S is connected at the first stationary contact a to the input terminal 11, and at the second stationary contact b to the output terminal 12. A common contact c is connected through a capacitor Cs to ground. Potentials Vi and Vo with respect to ground potential are applied to the input and output terminals, respectively. As shown in FIG. 1A, when the switch S is turned to the contact a, the charge Q1 stored in the capacitor Cs is given by $Q1 = Cs \times Vi$. When it is turned to the contact b, as shown in FIG. 1B, the charge Q2 stored in the capacitor Cs is expressed by $Q2 = Cs \times Vo$. The switching operation of the switch S from the input terminal 11 to the output terminal 12 is equivalent to the movement of $\Delta Q$ from the input terminal 11 to the output terminal 12. $\Delta Q$ is $$\Delta Q = Q1 - Q2 = Cs(Vi - Vo) \quad (1)$$

When the switch S is switched $f_s$ times per second, an average current i flowing from the input terminal 11 to the output terminal 12 is given $$i = \Delta Q \cdot f_s = Cs(Vi - Vo)f_s \quad (2)$$

If the switching frequency $f_s$ of the switch S is sufficiently larger than the frequencies of the voltages Vi and Vo, the current i is equal to the current determined by the instantaneous values of the voltages Vi and Vo. Accordingly, the circuit shown in FIGS. 1A and 1B is equivalent to a circuit with a resistor connected between the input and output terminals 11 and 12. Here, the resistor R is given $$R = \frac{Vi - Vo}{i} = \frac{1}{Cs \cdot f_s} \quad (3)$$

As described above, in the switched capacitor circuit, the capacitor Cs connected at one end to the reference potential is switched at the other end between two different potential terminals. Equivalently, the resistor R is connected between the two potential terminals. The switched capacitor is the integrator formed by using the switched capacitor unit.

Figure 3:
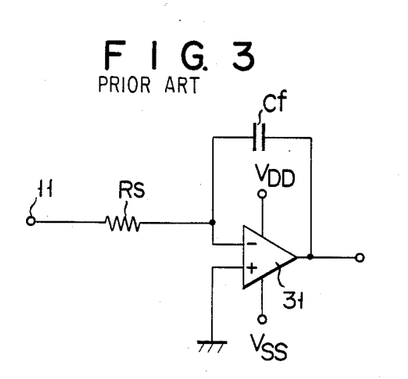
FIGS. 3 and 4 are circuit diagrams of prior mirror integrators.

FIG. 3 shows a mirror integrator formed using the operational amplifier 31 and its input vs. output characteristic is mathematically expressed by the following equation $$\frac{Vo}{Vi} = -\frac{1}{S \cdot Rs \cdot Cf} \quad (4)$$

where Vi is an input voltage, Vo an output voltage and Rs a resistance of an input resistor between the input terminal 11 and the inverting input terminal (−) of the amplifier 31, Cf a capacitance of a feedback capacitor connected between the output terminal and the inverting input terminal (−) of the amplifier 31, and S is the Laplacian.

In FIG. 3, $V_{DD}$ and $V_{SS}$ are power sources, and the non-inverting input terminal (+) of the amplifier 31 is connected to ground.

Figure 4:
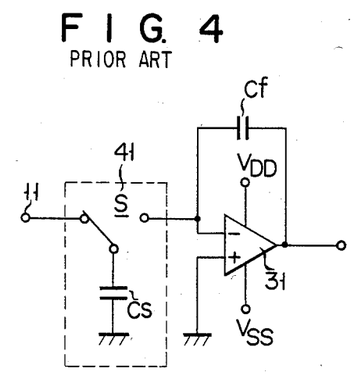

FIG. 4 shows a mirror integrator formed using the switched capacitor circuit 41 in place of the resistor Rs in the circuit shown in FIG. 3. The input vs. output characteristic of the circuit 41 is such that the R in the equation (3) is substituted into the Rs in the equation (4), and is given $$\frac{Vo}{Vi} = -\frac{f_s}{S(Cf/Cs)} \quad (5)$$

As seen from the equation (5), the input vs. output characteristic of the mirror integrator is a linear function of a capacitance ratio of the capacitances Cs and Cf, and the switching frequency $f_s$ of the switch S. This indicates that the integration time constant may be changed proportional to the frequency $f_s$, and that the filter formed using the mirror integrator shown in FIG. 4 can switch the filtering frequency proportional to the switching frequency $f_s$.

FIGS. 5A, 5B, 6A and 6B show mirror integrators equivalent to the mirror integrator shown in FIG. 4. In the mirror integrators shown in these figures, switched capacitor circuits 50 and 60 are each provided with two switches S1 and S2. Both ends of the capacitor Cs can simultaneously be switched by the switches S1 and S2. The first stationary contact a1 of the switch S1 is connected to the input terminal 11; the second stationary contact b1 to ground; the common contact to one end of the capacitor Cs. The first stationary contact a2 of the switch S2 is connected to the inverting input terminal (−) of the amplifier 31; the second stationary contact b2 to ground; the common contact to the other terminal of the capacitor Cs. Incidentally, in the mirror integrators, the switched capacitor circuit is used for the resistor with a positive resistance.

Figure 5A:
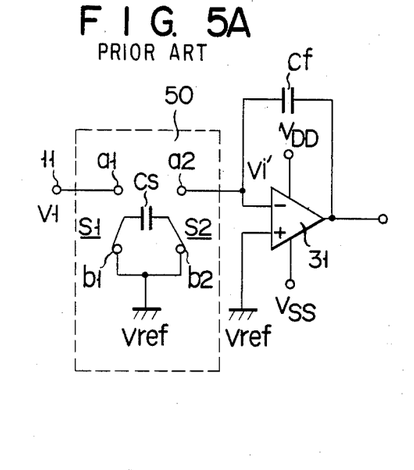
FIGS. 5A and 5B show circuit diagrams of the prior switched capacitor integrator.
Figure 5B:
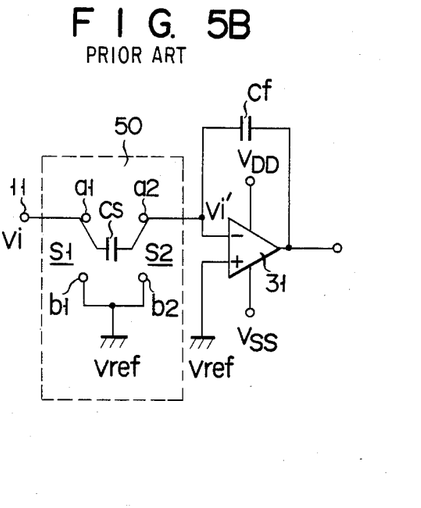

When the switches S1 and S2 are turned to the stationary contacts b1 and b2, respectively, as shown in FIG. 5A, the charge of the capacitor Cs is discharged to zero. As shown in FIG. 5B, when the switches S1 and S2 are connected to the stationary contacts a1 and a2, respectively, as shown in FIG. 5B, the charge Q given by the following equation is stored in the capacitor Cs.

$$Q = Cs(Vi - Vi') \quad (6)$$

where Vi is a voltage applied to the terminal 11 and Vi' is a voltage applied to the inverting input terminal (−) of the amplifier 31.

The average current i of the capacitor Cs is given by $$i = Cs(Vi - Vi')f_s \quad (7)$$

where $f_s$ is the switching frequency of the switches S1 and S2. Further, the equivalent resistance R between the stationary contacts a1 and a2 is $$R = \frac{Vi - Vi'}{i} = \frac{1}{Cs \cdot f_s} \quad (8)$$

The equation (8) is the same as the equation (3). The switched capacitor circuit 50 shown in FIGS. 5A and 5B is equivalent to the switched capacitor circuit 41 shown in FIG. 4. In the mirror integrators shown in FIGS. 6A and 6B, the switched capacitor circuit is used as a resistor with a negative resistance.

Figure 6A:
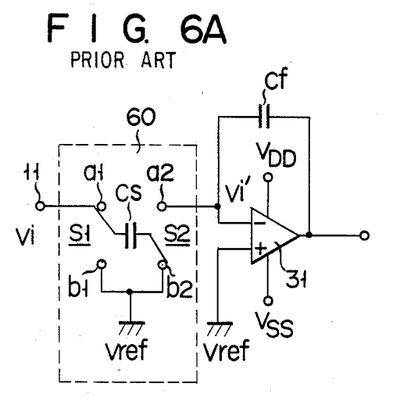
FIGS. 6A and 6B are circuit diagrams of another prior switched capacitor integrator.

As shown in FIG. 6A, when the switches S1 and S2 are turned to the first and second contacts a1 and b2, respectively, the charge Q given by the following equation is charged into the capacitor Cs.

$$Q = C_s \cdot V_i \quad (9)$$

Figure 6B:
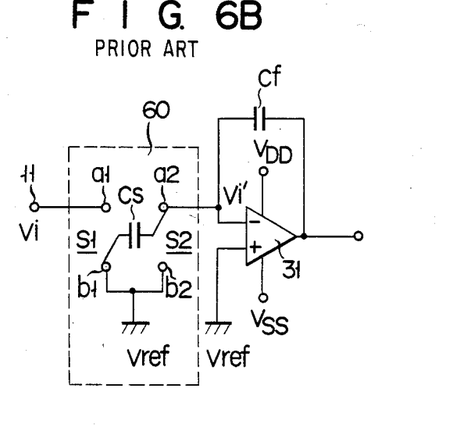

When the switches S1 and S2 are turned to the second and first stationary contacts b1 and a2, respectively, as shown in FIG. 6B, the charge Q stored in the capacitor Cs and given by the equation (9) is supplied to the inverting input terminal (−) of the amplifier 31. Therefore, if the switching frequencies $f_s$ of the switches S1 and S2 is sufficiently larger than that of the voltages Vi and Vi', an equivalent resistance circuit given by $R = 1/(C_s \times f_s)$ is formed.

Figure 7:
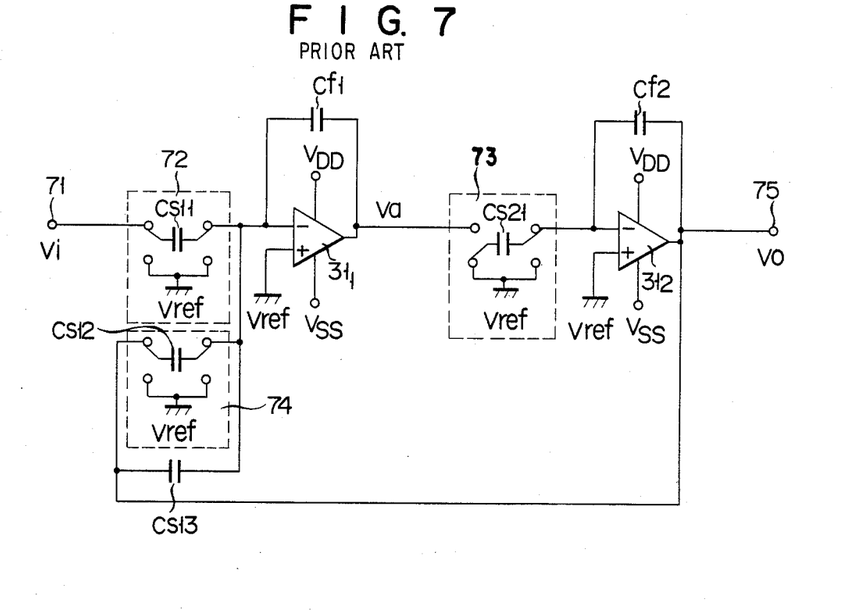
FIG. 7 is a circuit diagram of a prior low pass filter formed using the switched capacitor integrators as shown in FIGS. 5A, 5B, 6A and 6B.

A low pass filter formed using the mirror integrator with the switched capacitor circuit is shown in FIG. 7. The input signal Vi supplied to the input terminal 71 is applied through the switched capacitor circuit 72 serving as a positive resistor to the inverting input terminal (−) of the first operational amplifier $31_1$. The amplifier $31_1$ is connected to the two power source voltages $V_{DD}$ and $V_{SS}$, and its output terminal is connected to a switched capacitor circuit 73 at the next stage serving as a negative resistor, and through the first feedback capacitor Cf1 to the inverting input terminal (−). Ground potential as a reference potential is coupled with the non-inverting input terminal (+) of the amplifier $31_1$. The output signal Va of the amplifier $31_1$ is applied through the switched capacitor circuit 73 to the inverting input terminal (−) of the second operational amplifier $31_2$. Two power source voltages $V_{DD}$ and $V_{SS}$ are applied to the amplifier $31_2$. The output terminal of the amplifier $31_2$ is connected to the output terminal 75 of the device (low pass filter) and through the second feedback capacitor Cf2 to the inverting input terminal (−). Ground potential as the reference voltage is applied to the non-inverting input terminal (+) of the amplifier $31_2$. Further, the output terminal of the amplifier $31_2$ is connected to the inverting input terminal (−) of the amplifier $31_1$ through a switched capacitor circuit 74 serving as a positive resistor and a third capacitor Cs13 connected in parallel with the circuit 74. The output signal Vo of the amplifier $31_2$ is fed back to the inverting input terminal (−) of the amplifier $31_1$.

In operation, the output signal Va of the amplifier $31_1$ is given by $$V_a = -\frac{C_{s11}}{S \cdot C_{f1}} f_s \cdot V_i - \frac{C_{s12}}{S \cdot C_{f1}} f_s \cdot V_o - \frac{C_{s13}}{C_{f1}} V_o \quad (10)$$

where $f_s$ is the number of switchings per second of the switched capacitors Cs11 and Cs12, and S is the Laplacian.

The output signal Vo of the amplifier $31_2$ has a positive value since the switched capacitor circuit 73 is used as a negative resistor, and is given by the following equation $$V_o = \frac{C_{s21}}{S \cdot C_{f2}} f_s \cdot V_a \quad (11)$$

Substituting the equation (10) into the equation (11), we have a transfer function $H_{(s)}$ between the input signal Vi and the output signal Vo as given by $$H_{(s)} = \frac{V_o}{V_i} = \quad (12)$$

$$-\frac{\frac{C_{s11}}{C_{f1}} f_s \cdot \frac{C_{s21}}{C_{f2}} f_s}{S^2 + S \frac{C_{s13}}{C_{f1}} \cdot \frac{C_{s21}}{C_{f2}} f_s + \frac{C_{s12}}{C_{f1}} f_s \cdot \frac{C_{s21}}{C_{f2}} f_s}$$

The transfer function of the low pass filter is generally given $$H_{(s)LPF} = \frac{G \cdot b_o \cdot w_c^2}{S^2 + b_1 \cdot w_c \cdot S + b_o \cdot w_c^2} \quad (13)$$

where G is a gain of the filter, $w_c$ is an angular velocity at −3 dB and $2\pi f_c$.

When a low pass filter of the Butterworth is used for the low pass filter, "$b_o = 1$" and "$b_1 = \sqrt{2}$". Further, when comparing the equations (12) and (13), we have $$\frac{C_{s11}}{C_{f1}} f_s \cdot \frac{C_{s21}}{C_{f2}} f_s = w_c^2 \quad (14)$$

$$\frac{C_{s13}}{C_{f1}} \cdot \frac{C_{s21}}{C_{f2}} f_s = b_1 \cdot w_c \quad (15)$$

$$\frac{C_{s12}}{C_{f1}} f_s \cdot \frac{C_{s21}}{C_{f2}} f_s = w_c^2 \quad (16)$$

From the equations (14), (15) and (16), the following equations (17) and (18) are obtained.

$$\frac{C_{s11}}{C_{f1}} f_s = \frac{C_{s21}}{C_{f2}} f_s = \frac{C_{s12}}{C_{f1}} f_s = w_c \quad (17)$$

$$\frac{C_{s13}}{C_{f1}} = b_1 \quad (18)$$

Therefore, the low pass filter of the Butterworth type can be formed by making the integration constant of the first stage containing the switched capacitor circuits 72 and 74 and the amplifier 31 equal to that of the second stage containing the switched capacitor circuit 73 and the amplifier $31_2$, and by setting the capacitance of the capacitor Cs13 to a value $\sqrt{2}$ times that of the capacitor Cf1.

As shown in FIGS. 4, 5A, 5B, 6A and 6B, the switched capacitor integrator used as the mirror integrator needs a single power source terminal connected to the reference power source Vref (ground) in addition to the two power source terminals connected to the two power sources $V_{DD}$ and $V_{SS}$. The low pass filter formed using such mirror integrator needs three power source terminals. When such low pass filter is fabricated together with the ordinary random logic of the type using two power sources $V_{DD}$ and $V_{SS}$, a reference power source terminal must additionally be used in addition to the two power source terminals.

The increase of the power source terminals provides a great problem in fabricating the integrated circuits in that the circuit is complicated, the chip area increases, and the pattern design for the three power terminals is complicated. Further, the design of the printed circuit for mounting the integrated circuits is complicated, resulting in increase of the manufacturing cost.

SUMMARY OF THE INVENTION

Accordingly, an object of the present invention is to provide a low pass filter which can decrease the number of power source terminals and therefore is well adaptable for the integrated circuit.

According to the present invention, there is provided a low pass filter comprising first and second power sources, first operational amplifier means driven by the first and second power sources, first feedback capacitor means connected between the inverting input terminal of the amplifier means and its output terminal, a first switched capacitor circuit connected between the signal input terminal applied with the input voltage signal and the inverting input terminal of the first amplifier means or to the first power source, second operational amplifier means connected to the first and second power sources, second feedback capacitor means connected between the inverting input terminal of the second amplifier means and its output terminal, second switched capacitor circuit connected between the output terminal of the first amplifier and the first power source or between the inverting input terminal of the second amplifier means and the second power source, a third switched capacitor circuit connected between the output terminal of the second amplifier means and the inverting input terminal or to the first power source, parallel connected capacitor means connected in parallel with the third capacitor circuit, and a bias circuit connected to the first and second power sources and of which a given potential point is connected to the non-inverting input terminals of the first and second amplifier means.

DETAILED DESCRIPTION OF THE PREFERRED EMBODIMENTS

Figure 8:
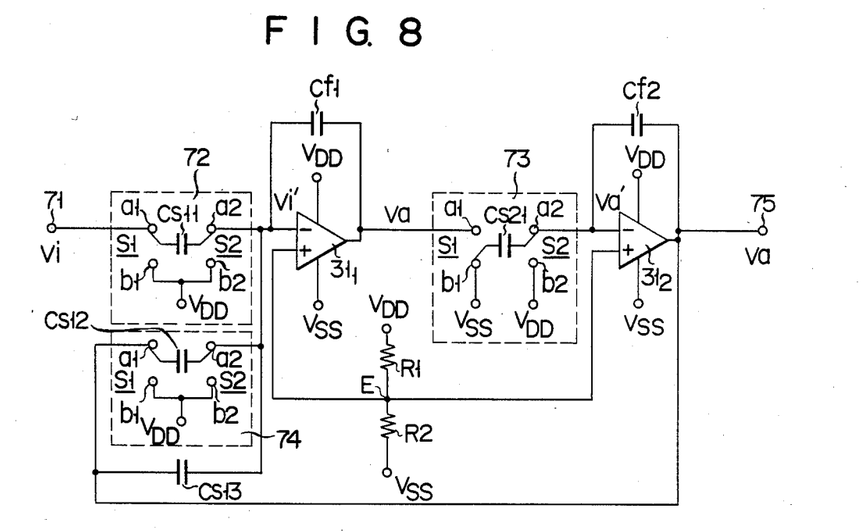
FIG. 8 is a circuit diagram of an embodiment of a low pass filter according to the present invention.

Referring to FIG. 8, there is shown an embodiment of a low pass filter according to the present invention. In the figure, an input terminal 71 is connected to the inverting input terminal (−) of a first operational amplifier $31_1$ through a switched capacitor circuit 72 as a positive resistor. The input voltage signal Vi is applied to the input terminal 71 and the signal Vi is applied to the inverting input terminal (−) of the amplifier $31_1$ through the switched capacitor circuit 72. Two voltages $V_{DD}$ and $V_{SS}$ are applied as drive sources to the amplifier $31_1$. The output terminal of the amplifier $31_1$ is connected to a switched capacitor circuit 73 at the next stage serving as a negative resistor and through the first feedback capacitor Cf1 to the inverting input terminal (−). The non-inverting input terminal (+) of the amplifier $31_1$ is connected to a junction between the resistors R1 and R2 connected in series between the two power sources $V_{DD}$ and $V_{SS}$ connected to the amplifier $31_1$. The amplifier $31_1$ is connected at the output terminal to the switched capacitor circuit 73 and through the capacitor 73 to the inverting input terminal (−) of the second operational amplifier $31_2$. Accordingly, the output voltage signal Va of the first amplifier $31_1$ is applied through the switched capacitor circuit 73 to the inverting input terminal (−) of the second amplifier $31_2$.

The two power sources $V_{DD}$ and $V_{SS}$ as drive sources are connected to the second amplifier $31_2$ of which the output terminal is connected to the output terminal of a device, i.e. a low pass filter, and through the second feedback capacitor Cf2 to the inverting input terminal (−). The non-inverting input terminal (+) of the amplifier $31_2$ is connected to a junction between two resistors connected in series between the two power sources $V_{DD}$ and $V_{SS}$, as in the case of the amplifier $31_1$. The output terminal of the amplifier $31_2$ is connected to the inverting input terminal (−) of the amplifier $31_1$ through a switched capacitor circuit 74 serving as a positive resistor and a third capacitor Cs13 connected in parallel with the circuit 74. Accordingly, the output signal Vo of the amplifier $31_2$ is fed back to the inverting input terminal (−) of the amplifier $31_1$ through the switched capacitor circuit 74 and the capacitor Cs13.

The switched capacitor circuits 72 to 74 are each formed of a single switched capacitor and a single switch. To be more specific, the switched capacitor circuit 72 is comprised of a switch capacitor Cs11, a first switch S1 which is connected at the first stationary contact a1 to the signal input terminal 71, at the second stationary contact b1 to the power source $V_{DD}$, and at the common contact to the one end of the switched capacitor Cs11, and a second switch S2 which is connected at the first stationary contact a2 to the inverting input terminal (−) of the amplifier $31_1$, and at the second stationary contact b2 to the power source $V_{DD}$, and at the common contact to the other end of the switched capacitor Cs11. Switches S1 and S2 of the switch capacitor circuit 72 operate such that the switched capacitor Cs11 is inserted between the signal input terminal 71 and the inverting input terminal (−) of the amplifier $31_1$ or short-circuits both ends of the switched capacitor Cs11. In the first switched mode, the common contacts of the switches S1 and S2 are connected to the contacts a1 and a2, respectively, to connect the switched capacitor Cs11 between the signal input terminal 71 and the inverting input terminal (−) of the amplifier 72. In the second switched mode, the common contacts of the switches S1 and S2 are connected to the contacts b1 and b2, respectively, to short-circuit both ends of the switched capacitor Cs11. Since the contacts b1 and b2 are connected to the power source $V_{DD}$, the switched capacitor Cs11 is short-circuited and connected to the power source $V_{DD}$.

The second capacitor circuit 73 is comprised of a switched capacitor Cs21, a first switch S1 which is connected at the first stationary contact a1 to the output terminal of the amplifier $31_1$, at the second stationary contact b1 to the power source $V_{SS}$, and at the common contact to one end of the switched capacitor Cs21, and a second switch S2 which is connected at the first stationary contact a2 to the inverting input terminal (−) of the amplifier $31_2$, at the second stationary contact b2 to the power source $V_{DD}$, and at the common contact to the other terminal of the switched capacitor Cs21. The switches S1 and S2 of the switched capacitor circuit 73 operate to change between the inverting input terminal (−) of the amplifier $31_2$ and the power source $V_{SS}$, and between the output terminal of the amplifier $31_1$ and the power source $V_{DD}$. In the first switched mode, the common contact of the switch S1 is connected to the contact b1, and the common contact of the switch S2 is connected to the contact a2. Then the switched capacitor Cs21 is connected to the inverting input terminal (−) of the amplifier $31_2$ and the power source $V_{SS}$. In the second switched mode, the common contact of the switch S1 is connected to the contact a1 and the common contact of the switch S2 to the contact b2. Then, the switched capacitor Cs21 is connected to the output terminal of the amplifier $31_1$ and the power source $V_{DD}$.

The third switched capacitor circuit 74 is comprised of a switched capacitor Cs12, a first switch S1 which is connected at the first stationary contact a1 to the output terminal of the amplifier $31_2$, at the second stationary contact b1 to the power source $V_{DD}$, and at the common contact to one end of the switched capacitor Cs12, and a second switch S2 which is connected at the first stationary contact a2 to the inverting input terminal (−) of the amplifier $31_1$, at the second stationary contact b2 to the power source $V_{DD}$, and at the common contact to the other end of the switched capacitor Cs12.

In the present embodiment, the power source $V_{DD}$ is supplied to the second contacts b1 and b2 of the switches S1 and S2 in the first and third switched capacitor circuits 72 and 74, the power source $V_{SS}$ is supplied to the second contact b1 of the switch S1, and the power source $V_{DD}$ is supplied to the second contact b2. A proper bias voltage between the power source voltage $V_{DD}$ and the power source voltage $V_{SS}$ is applied to the non-inverting input terminals (+) of the amplifiers $31_1$ and $31_2$. In this respect, the present embodiment is different from the prior low pass filter shown in FIG. 7. The bias circuit, using the power sources $V_{DD}$ and $V_{SS}$ as its drive source, forms the bias voltage using the power sources $V_{DD}$ and $V_{SS}$, and supplies the formed bias voltage to the non-inverting input terminals (+) of the amplifiers $31_1$ and $31_2$. A value of the bias voltage is set to a proper value according to the characteristics of the amplifiers $31_1$ and $31_2$. For setting the bias voltage to "$(\frac{1}{2}) \times (V_{DD} - V_{SS})$", for example, two resistors with the same resistances are connected in series between the power sources $V_{DD}$ and $V_{SS}$ and the junction between the two resistors is connected to the non-inverting input terminals (+) of the amplifiers $31_1$ and $31_2$. With the two resistors having different resistances in place of the resistors R1 and R2, the bias voltage with a proper value according to a ratio of the resistances can be produced from the junction between the resistors.

Figure 9A:
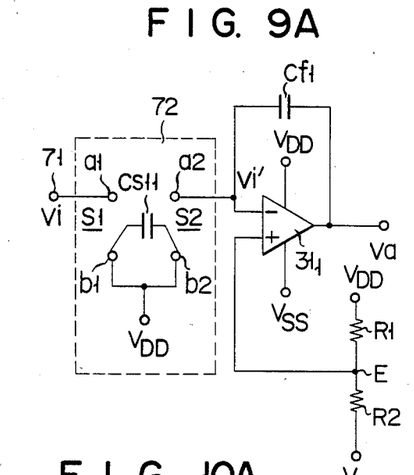
FIGS. 9A and 9B, 10A and 10B are circuit diagrams of a part of the low pass filter shown in FIG. 8.
Figure 9B:
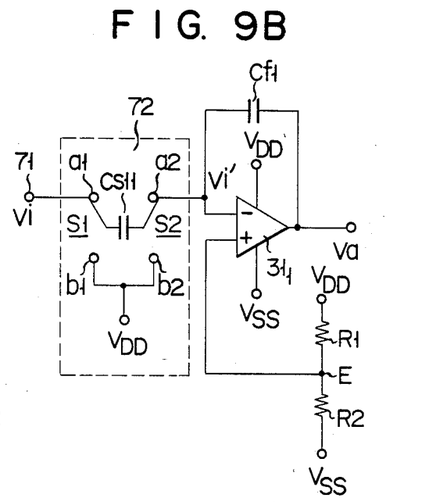

The operation of the mirror integrator using the switched capacitor circuit 72 as a positive resistor in the low pass filter shown in FIG. 8 will be described. The operation of the mirror circuit using the switched capacitor circuit 74 as a positive resistor will not be described, since it is similar to the former integrator. In the circuit shown in FIGS. 9A and 9B, only the mirror integrator using the switched capacitor circuit 72 in the low pass filter shown in FIG. 8 is illustrated. When the switches S1 and S2 are in the second switched mode in which the common contacts of the switches S1 and S2 are turned to b1 and b2, as shown in FIG. 9A, the switched capacitor Cs11 is short-circuited and connected to the power source $V_{DD}$. Therefore, the charge stored in the switched capacitor Cs11 is discharged to zero. When the switches are in the first mode in which their common contacts are turned to the first contacts a1 and a2, as shown in FIG. 9B, the charge given by the following equation is stored in the capacitor Cs11.

$$Q = Cs11(Vi - Vi') \qquad (19)$$

where Vi is a voltage of the signal input terminal 71, and Vi' is a voltage of the inverting input terminal (−) of the amplifier 31. The average current i flowing into the capacitor Cs11 is given $$i = Cs11(Vi - Vi')f_s \qquad (20)$$

And its equivalent resistance is $$R = \frac{Vi - Vi'}{i} = \frac{1}{Cs11 \cdot f_s} \qquad (21)$$

The equation (21) is substantially equal to the equation (3). The circuit shown in FIGS. 9A and 9B has the same function as that of the FIGS. 5A and 5B circuit. Accordingly, the input vs. output characteristic of the mirror integrator is substantially expressed by the equation (5), and is expressed $$\frac{Va}{Vi} = \frac{f_s}{S(Cf1/Cs11)}$$

As seen from the equation, even if the reference power source Vref connected to the capacitor circuit 50 is substituted by the power source $V_{DD}$ used as the drive power source, the operation of the mirror integrator is ensured.

Figure 10A:
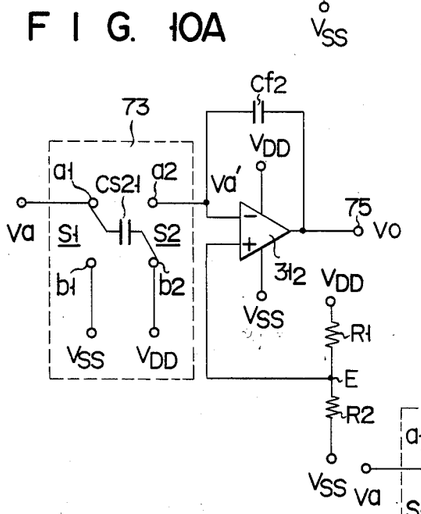
Figure 10B:
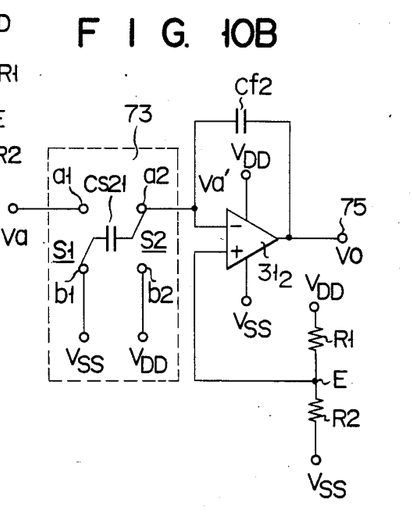

FIGS. 10A and 10B show only the mirror integrator using the switched capacitor circuit 73 as a negative resistor 73 in the low pass filter shown in FIG. 8. As shown in FIG. 10A, when the switches S1 and S2 are in the second switched mode, that is, when the common contacts of the switches S1 and S2 are in contact with the first contacts a1 and b2, a potential difference $(Va - V_{DD})$ is applied across the switched capacitor Cs21. Accordingly, the charge Qa given by the following equation is stored in the capacitor Cs21.

$$Qa = Cs21(Va - V_{DD})$$

As shown in FIG. 10B, when the common contact of the switch S1 is turned to the second contact b1 or the common contact of the switch S2 to the first contact a2, a potential difference $(V_{SS} - Va')$ is applied across the capacitor Cs21. Therefore, the charge Qb given by the following equation is stored in the capacitor Cs21.

$$Qb = Cs21(V_{SS} - Va')$$

When $V_{SS} = 0$, a moving charge quantity $\Delta Q$ is $$\Delta Q = -(Qa - Qb) \quad (22)$$
$$= -Cs21(Va + Va' - V_{DD})$$

Since the potential of $(V_{DD}/2)$ is applied to the non-inverting terminal (+) of the amplifier circuit $31_1$ by the bias circuit, the equation (22) can be rewritten into $$\Delta Q = -Cs21(Va - Va')$$

The average current i flowing between the contacts a1 and a2 and the equivalent resistance R are $$i = \Delta Q \cdot f_s = -Cs21(Va - Va') \cdot f_s \quad (23)$$

$$R = \frac{Va - Va'}{i} = -\frac{1}{Cs21 \cdot f_s} \quad (24)$$

When comparing the equations (23) and (24) with the equations (20) and (21), these are identical except the minus (−) signs. This indicates that the switched capacitor circuit shown in FIGS. 10A and 10B operates as a negative resistor. Accordingly, the circuit shown in FIGS. 10A and 10B has the same function as that of the FIG. 6 circuit. And its input vs. output characteristic is given by $$\frac{Vo}{Va} = \frac{Cs21}{S \cdot Cf2} f_s \quad (25)$$

As seen from the above equation, in the switched capacitor of the circuit shown in FIGS. 6A and 6B, even if the reference power source Vref connected to the second contacts b1 and b2 of the switches S1 and S2 is replaced by the contact b1, and the power source $V_{CC}$ is replaced by the contact b2, it operates as a mirror integrator.

From the description on the switched capacitor circuits which has been made referring to FIGS. 10A and 10B, the switched capacitor circuits 72 to 74 are driven by the two drive power sources $V_{DD}$ and $V_{SS}$ for the amplifiers $31_1$ and $31_2$. Accordingly, the low pass filter incorporating the switched capacitor circuits 72 to 74 shown in FIG. 8 are driven by only two power sources $V_{DD}$ and $V_{SS}$ and only two power source terminals are required. Thus, three power source terminals of the prior art device can be reduced by one. In this respect, the present embodiment is well adaptable for the integrated circuit fabrication.

Figure 11:
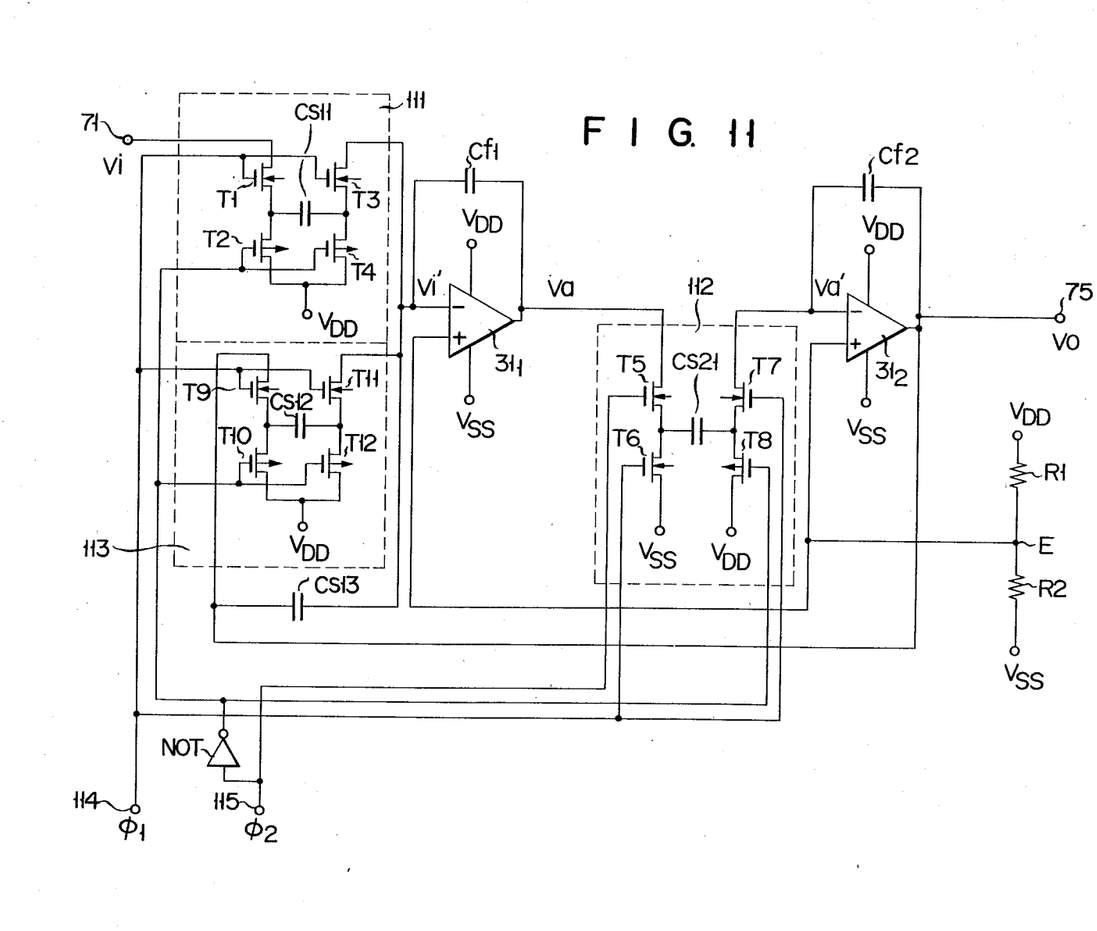
FIG. 11 is a circuit diagram of a detailed circuit diagram of a low pass filter shown in FIG. 8.

FIG. 11 shows a circuit diagram of the switched capacitor circuits 72 to 74 in the low pass filter in FIG. 8 when it is fabricated into an integrated circuit. In FIG. 11, the switched capacitor circuits 111 to 113 correspond to the switched capacitor circuits 72 to 74 in the FIG. 8 filter. In the switched capacitor circuit 111, T1 and T3 are field effect transistors of the N channel type. Transistors T2 and T4 are field effect transistors of the P channel type. The transistor T1 serves as a first switch circuit; the transistor T2 as a second switch circuit. The transistors T1 and T2 cooperate to form the selector switch S1 in the FIG. 8 filter. The transistor T3 serves as a third switch circuit and the transistor T4 as a fourth switch circuit, and the transistors T3 and T4 cooperate to form a selector switch S2 in the filter of FIG. 8. By clock pulses $\phi1$ and $\phi2$, the transistors T1 and T3 are controlled to be set in the same switched mode and the transistors T2 and T4 are similarly controlled to be set in the same switched mode. The switched capacitor circuit 111 will be described in more detail. The drain of the transistor T1 is connected to the signal input terminal 71. The drain of the transistor T2 is connected to the power source $V_{DD}$. The sources of the transistors T1 and T2 are interconnected to each other. The junction between the transistors T1 and T2 is connected to one end of the capacitor Cs11. The drain of the transistor T3 is connected to the inverting input terminal (−) of the operational amplifier 31. The drain of the transistor T4 is connected to the power source $V_{DD}$. The sources of the transistors T3 and T4 are interconnected each other and the junction therebetween is connected to the other end of the capacitor Cs11. The gates of the transistors T1 and T3 are connected together to the clock input terminal 114. The gates of the transistors T2 and T4 are connected together to the clock input terminal 115 through an inverter NOT. The clock input terminals 114 and 115 are supplied with clock pulses $\phi1$ and $\phi2$ which have period of $1/f_s$ and the logic levels which are not concurrently "1". Accordingly, when the clock pulse $\phi1=0$ and $\phi2=1$, the transistors T1 and T3 are OFF and the transistors T2 and T4 are not ON. The result is that it is in the switched mode shown in FIG. 9A. When $\phi1=1$ and $\phi2=0$, the transistors T1 and T3 are ON and the transistors T2 and T4 are OFF. The result is that it is in the switched mode shown in FIG. 9B.

In the switched capacitor circuit 112, transistors T5 to T7 are field effect transistors of the N channel type, and T8 is a field effect transistor of the P channel type. The transistor T5 serving as the first switching circuit T5 and the transistor T6 serving as the second switching circuit cooperate to form a selector switch S1 in the switched capacitor circuit 73 in the filter shown in FIG. 8. The transistor T7 serving as the third switching circuit and the transistor T8 serving as the fourth switching circuit cooperate to form the selector switch S2. Under control of clock pulses $\phi1$ and $\phi2$, the transistors T5 and T8 are in the same switched mode and the transistors T6 and T7 are in the same switched mode. The drain of the transistor T5 is connected to the output terminal of the amplifier $31_1$. The source of the transistor T6 is connected to the power source $V_{SS}$. The source of the transistor T5 and the drain of the transistor T6 are interconnected to each other and the junction therebetween is connected to one end of the capacitor Cs21. The drain of the transistor T7 is connected to the input terminal (−) of the amplifier $31_2$. The drain of the transistor T8 is connected to the power source $V_{DD}$. The transistors T7 and T8 are interconnected with each other and the junction between is connected to the other end of the capacitor Cs21. The gate of the transistor T5 is connected to the clock input terminal 115 and the gates of the transistors T6 and T7 are connected together to the clock input terminal 114. The gate of the transistor T8 is connected to the clock input terminal 115 through the inverter NOT. With this arrangement and with the application of the clock pulses $\phi1$ and $\phi2$, the transistors T5 and T8 are ON when $\phi2="1"$ and the transistors T6 and T7 are OFF, thus being in the switched mode as shown in FIG. 10A. When $\phi1="1"$ and $\phi2="0"$, the transistors T5 and T8 are OFF and the transistors T6 and T7 are ON, thus being in the switched mode as shown in FIG. 10B.

In the switched capacitor circuit 113, T9 and T11 are field effect transistors of the N channel type. Transistors T10 and T12 are field effect transistors of the P channel type. Their operation and the arrangement are substantially the same as those of the switched capacitor circuit 111, and no explanation of them will be given.

In FIG. 11, a single transistor is used for each of the first to fourth switch circuits for the switched capacitors 111 to 113. In place of this, an analog switch such as a transistor switch, for example, a transmission gate may be used.

Figure 12:
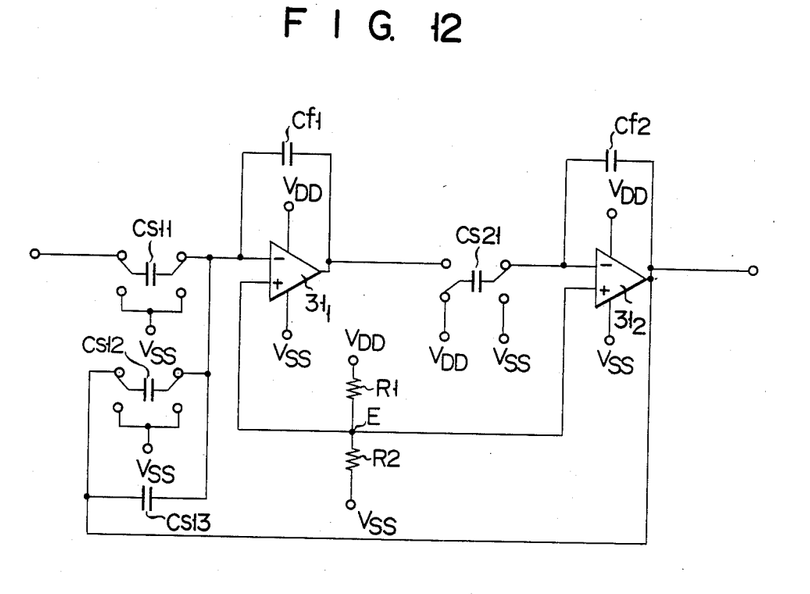
FIG. 12 shows a circuit diagram of another embodiment of a low pass filter according to the present invention.

FIG. 12 shows another embodiment of the present invention. In the present embodiment, the power sources $V_{DD}$ and $V_{SS}$ applied to the switched capacitor circuits 72 to 74 in the low pass filter of FIG. 8 are interchanged. With this arrangement, the switched capacitor circuits 72 to 74 can be operated as equivalent resistor elements, as in the FIG. 8 embodiment.

In the embodiments as mentioned above, the bias circuit for applying the voltage $V_E$, for example, $(V_{DD}-V_{SS})/2$, to the non-inverting input terminals (+) of the amplifiers $31_1$ and $31_2$ may be modified variously in addition to the above-mentioned one. For example, a voltage drop circuit with small current consumption can be used for the bias circuit. When the MOS transistor is used at the first stage for the amplifier $31_1$, the input impedance at the non-inverting input terminal is almost infinite. Therefore, a high input impedance circuit may be used for the bias circuit for generating the voltage $V_E$. Such a bias circuit has a small power consumption and therefore is well adaptable for the integrated circuit.

When the output potential $V_E$ of the bias circuit in the low pass filter of FIG. 8 is set to $\frac{1}{2}(V_{DD}-V_{SS})$, the output potential $V_E$ is equal to the reference potential Vref in the prior filter shown in FIG. 7. Accordingly, it may be considered that the output potential of the bias circuit in the FIG. 8 filter can be used for the reference potential Vref applied to the switched capacitor circuit in the prior filter shown in FIG. 7. This is problematic in practical use, however. The output of the bias circuit has a higher impedance than that of the power source. Therefore, in such arrangement, when the switched capacitor is short-circuited to be discharged, the output potential of the bias circuit slightly changes. The result is that the integration constant changes and the potential of the input signal to the input terminal (+) of the non-inverting input terminal (+) of the amplifier changes. With this potential change of the input signal, the output potential of the amplifier changes, possibly causing an erroneous operation of the circuit. For this reason, in the embodiment shown in FIG. 8, the output potential $V_E$ of the bias circuit is merely applied to the non-inverting input terminal (+), but the voltage is not applied to the switched capacitor circuits 72 to 74.

As described above, in the low pass filter of the present invention, the power source for the operational amplifier is connected to the discharge path of the switched capacitor circuit and the bias circuit is formed using the power sources for the operational amplifier, the bias voltage from the bias circuit is applied for the inverting input terminal of the operational amplifier. With this arrangement, the number of the necessary power sources, i.e. the number of the power source terminals, can be reduced. In fabricating the circuit by the integration technology, the problems inherent to the prior art such as the complicated pattern design and the increased chip area are successfully solved. The arrangement according to the present invention is well adapted for integrated circuit fabrication.

What we claim is:

1. A low pass filter comprising:

first and second power source terminals for connection to first and second power sources, respectively;

first operational amplifier means connected to said first and second power source terminals to be driven by said first and second power sources;

first feedback capacitor means connected between the inverting input terminal of said first amplifier means and its output terminal;

a first switched capacitor circuit connected between a signal input terminal applied with an input voltage signal and the inverting input terminal of said first amplifier means in a first switched mode, and directly short-circuited and connected to said first power source terminal in a second switched mode;

second operational amplifier means connected to said first and second power source terminals to be driven by said first and second power sources;

second feedback capacitor means connected between the inverting input terminal of said second amplifier means and its output terminal;

a second switched capacitor circuit connected between said output terminal of said first amplifier means and said first power source terminal in a first switched mode, and between said inverting input terminal of said second amplifier means and said second power source terminal in a second switched mode;

a third switched capacitor circuit connected between said output terminal of said second amplifier means and said inverting input terminal of said first operational amplifier means in a first switched mode, and directly short-circuited and connected to said first power source terminal in a second switched mode;

parallel connected capacitor means connected in parallel with said third switched capacitor circuit, said capacitor means being connected between the inverting terminal of said first amplifier means and the output terminal of said second amplifier means; and a bias circuit connected to said first and second power source terminals source terminals for producing a bias voltage, said bias voltage being connected to the non-inverting input terminals of said first and second amplifier means, said first, second and third switched capacitor circuits being separated from the non-inverting input terminals of said first and second amplifier means.

2. A low pass filter according to claim 1, in which said first switched capacitor circuit includes a switched capacitor element, and a switching circuit which in a first switched operation mode connects said switched capacitor element between said signal input terminal and said inverting input terminal of said first amplifier means, and in a second switched operation mode connects both ends of said switched capacitor element to said first power source terminal.

3. A low pass filter according to claim 1, in which said second switched capacitor circuit includes a switched capacitor element, and a switching circuit which in a second switched operation mode connects said capacitor element between the inverting input terminal of said second amplifier means and said second power source terminal and in a first switched operation mode connects said capacitor element between the output terminal of said first amplifier means and said first power source terminal.

4. A low pass filter according to claim 1, in which said third switched capacitor circuit includes a switched capacitor element and a switching circuit which in a first switched operation mode connects said capacitor element between the output terminal of said second amplifier means and the inverting input terminal of said first amplifier means, and in a second switched operation mode connects both ends of said switched capacitor element to said first power source terminal.

5. A low pass filter according to claim 1, in which said bias circuit includes first and second resistors connected in series between said first and second power source terminals, said bias voltage being applied from the junction between said resistors to the non-inverting input terminal of said first and second amplifier means.

* * * * *